(12) United States Patent
Enichlmair et al.

(10) Patent No.: US 11,107,848 B2
(45) Date of Patent: Aug. 31, 2021

(54) SEMICONDUCTOR DEVICE FOR DETECTION OF RADIATION AND METHOD OF PRODUCING A SEMICONDUCTOR DEVICE FOR DETECTION OF RADIATION

(71) Applicant: ams AG, Unterpremstaetten (AT)

(72) Inventors: Hubert Enichlmair, Weinitzen (AT);
Franz Schrank, Graz (AT); Joerg Siegert, Graz (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/772,055

(22) PCT Filed: Feb. 24, 2014

(86) PCT No.: PCT/EP2014/053551
§ 371 (c)(1),
(2) Date: Sep. 1, 2015

(87) PCT Pub. No.: WO2014/131731
PCT Pub. Date: Sep. 4, 2014

(65) Prior Publication Data
US 2016/0020238 A1    Jan. 21, 2016

(30) Foreign Application Priority Data
Mar. 1, 2013   (EP) ..................................... 13157432

(51) Int. Cl.
*H01L 27/146*     (2006.01)
*H01L 23/48*     (2006.01)

(52) U.S. Cl.
CPC ...... *H01L 27/14621* (2013.01); *H01L 23/481* (2013.01); *H01L 27/14618* (2013.01);
(Continued)

(58) Field of Classification Search
CPC .......... H01L 2924/00; H01L 27/14618; H01L 27/14627; H01L 2924/12043;
(Continued)

(56) References Cited

U.S. PATENT DOCUMENTS 7,041,956 B2 *  5/2006  Takahashi ......... H01L 27/14623
                                                250/208.1
7,248,297 B2    7/2007  Catrysse et al.
(Continued)

FOREIGN PATENT DOCUMENTS

CN          1476099 A      2/2004
CN        101887900 A     11/2010
(Continued)

*Primary Examiner* — David Chen
(74) *Attorney, Agent, or Firm* — MH2 Technology Law Group LLP

(57) ABSTRACT

The semiconductor device for detection of radiation comprises a semiconductor substrate (1) with a main surface (11), a dielectric layer (6) comprising at least one compound of a semiconductor material, an integrated circuit (2) including at least one component sensitive to radiation (3), a wiring (4) of the integrated circuit embedded in an intermetal layer (8) of the dielectric layer (6), an electrically conductive through-substrate via (5) contacting the wiring, and an optical filter element (7) arranged immediately on the dielectric layer above the component sensitive to radiation. The dielectric layer comprises a passivation layer (9) at least above the through-substrate via, the passivation layer comprises a dielectric material that is different from the intermetal layer (8), and the wiring is arranged between the main surface and the passivation layer.

2 Claims, 9 Drawing Sheets

(52) U.S. Cl.
CPC .. *H01L 27/14632* (2013.01); *H01L 27/14636* (2013.01); *H01L 27/14685* (2013.01); *H01L 27/14687* (2013.01); *H01L 2224/02372* (2013.01); *H01L 2224/0401* (2013.01); *H01L 2224/05548* (2013.01); *H01L 2224/13024* (2013.01)

(58) Field of Classification Search
CPC .......... H01L 27/1464; H01L 27/14685; H01L 27/14621; H01L 2224/05548; H01L 27/14687; H01L 27/14636
USPC .......... 257/432, 434, 435, E31.127
See application file for complete search history.

(56) References Cited

U.S. PATENT DOCUMENTS

| | | | |
|---|---|---|---|
| 2002/0063214 A1* | 5/2002 | Hsiao | G01J 5/08 |
| | | | 250/338.4 |
| 2005/0173064 A1 | 8/2005 | Miyanari | |
| 2006/0141653 A1* | 6/2006 | Choi | H01L 27/14621 |
| | | | 438/48 |
| 2006/0183265 A1* | 8/2006 | Oh | H01L 27/14632 |
| | | | 438/65 |
| 2007/0075408 A1 | 4/2007 | Shibayama et al. | |
| 2007/0114622 A1* | 5/2007 | Adkisson | H01L 21/76819 |
| | | | 257/414 |
| 2007/0158772 A1* | 7/2007 | Boettiger | H01L 27/14621 |
| | | | 257/432 |
| 2007/0249095 A1 | 10/2007 | Song et al. | |
| 2007/0275496 A1* | 11/2007 | Yamashita | H01L 27/14625 |
| | | | 438/57 |
| 2008/0042177 A1* | 2/2008 | Park | H01L 27/14687 |
| | | | 257/294 |
| 2008/0116537 A1 | 5/2008 | Adkisson et al. | |
| 2008/0191296 A1* | 8/2008 | Wang | H01L 27/14687 |
| | | | 257/432 |
| 2009/0147101 A1 | 6/2009 | Tatani et al. | |
| 2009/0218560 A1 | 9/2009 | Flaim et al. | |
| 2009/0256216 A1 | 10/2009 | Kierse | |
| 2009/0283847 A1 | 11/2009 | Kawasaki et al. | |
| 2010/0190338 A1* | 7/2010 | Koike | H01L 27/14683 |
| | | | 438/667 |
| 2010/0282945 A1 | 11/2010 | Yokogawa | |
| 2010/0314762 A1 | 12/2010 | Schrank et al. | |
| 2010/0327383 A1 | 12/2010 | Hayasaki et al. | |
| 2011/0024858 A1 | 2/2011 | Yoshihara et al. | |
| 2011/0186951 A1* | 8/2011 | Pyo | H01L 23/481 |
| | | | 257/432 |
| 2011/0260284 A1 | 10/2011 | Schrank et al. | |
| 2012/0193741 A1* | 8/2012 | Borthakur | H01L 31/0203 |
| | | | 257/433 |
| 2012/0286430 A1 | 11/2012 | Kraft et al. | |
| 2016/0190193 A1 | 6/2016 | Yokogawa | |

FOREIGN PATENT DOCUMENTS

| | | |
|---|---|---|
| DE | 10156465 C1 | 7/2003 |
| DE | 102008033395 B3 | 2/2010 |
| DE | 102009004725 A1 | 7/2010 |
| JP | 2002319667 A | 10/2002 |
| JP | 2004047682 A | 2/2004 |
| JP | 2004265959 A | 9/2004 |
| JP | 2006032967 A | 2/2006 |
| JP | 2009158862 A | 7/2009 |
| JP | 2009158944 A | 7/2009 |
| JP | 2009212463 A | 9/2009 |
| JP | 2010510646 A | 4/2010 |
| JP | 2010186870 A | 8/2010 |
| JP | 2010263158 A | 11/2010 |
| JP | 2011009645 A | 1/2011 |
| KR | 102009008655 | 8/2009 |
| KR | 102010012205 | 11/2010 |
| WO | WO-2008058847 A1 | 5/2008 |
| WO | 2009/084701 A1 | 7/2009 |
| WO | WO-2010/006916 A1 | 1/2010 |
| WO | 2010/081603 A1 | 7/2010 |
| WO | 2011/039167 A1 | 4/2011 |
| WO | 2012/007147 A1 | 1/2012 |

* cited by examiner

SEMICONDUCTOR DEVICE FOR DETECTION OF RADIATION AND METHOD OF PRODUCING A SEMICONDUCTOR DEVICE FOR DETECTION OF RADIATION

BACKGROUND OF THE INVENTION

US 2010/0327383 A1 discloses a semiconductor device comprising imaging elements with photodiodes and a through-electrode in a through-hole which penetrates the silicon substrate. Copper interconnection layers are embedded in silicon oxide interlayer insulating films. A base layer is formed on the uppermost interlayer insulating film and interconnection layer. Color filters are arranged on the base layer to correspond to the imaging elements.

US 2011/0024858 A1 discloses a solid-state imaging device comprising light-sensing portions in a semiconductor substrate, a wiring portion including a plurality of silicon oxide interlayer insulating films and wiring patterns on the substrate 11, and a through-via in the substrate. An organic planarizing film is arranged on the interlayer insulating film, and a color filter layer is arranged on the planarizing film.

WO 2009/084701 A1 discloses a semiconductor device comprising a silicon substrate, a plurality of imaging elements formed in element regions on the substrate surface, an $SiO_2$ interlayer dielectric film on the substrate surface, a base layer on the interlayer dielectric film, color filters on the base layer opposite the imaging elements, and an internal electrode, which is arranged on the conductor layer of a through-hole electrode penetrating the substrate and is electrically connected to the imaging element or to a peripheral circuit.

US 2007/249095 A1 discloses a semiconductor package including an infrared filter, which is bonded to a semiconductor wafer. The IR filter is obtained by applying a suitable filter layer on a glass sheet having the same dimensions as the wafer. The glass sheet is bonded to the wafer with the IR filter layer on the side facing towards the wafer. The wafer is thinned, so that the resulting total thickness of the wafer and the filter is not greater than the initial thickness of the wafer. Via holes are formed through the wafer from the side opposite the filter to contact pad electrodes that are located between the wafer and the filter.

US 2009/0256216 A1 discloses a wafer level chip scale package including a die substrate containing electronic circuits. Through-silicon vias are formed leading through the substrate and electrically connecting the electronic circuits to the bottom surface of the die substrate. An infrared sensor is coupled to the top surface of the die substrate, and a sensor aperture is formed in a protective encapsulant layer arranged above the sensor.

The formation of through-silicon vias in a semiconductor substrate is also described in WO 2010/006916 A1, US 2010/0314762 A1, WO 2010/081603 A1 and WO 2011/039167 A1.

Production methods using temporary bonding are described in US 2009/0218560 A1, DE 101 56 465 C1 and US 2005/0173064 A1.

U.S. Pat. No. 7,248,297 B2 discloses an integrated color pixel with at least one integrated metal filter adapted to obtain the desired wavelength responsivity.

WO 2012/007147 A1 discloses an optical bandpass filter system including a combination of a bandpass filter comprising a first nanostructured metallic layer and a bandstop filter comprising a second nanostructured metallic layer.

SUMMARY OF THE INVENTION

The semiconductor device for detection of radiation comprises a semiconductor substrate with a main surface, a dielectric layer comprising at least one compound of a semiconductor material, the dielectric layer being arranged on or above the main surface, an integrated circuit including at least one component sensitive to radiation, the integrated circuit being arranged in the substrate at or near the main surface, a wiring of the integrated circuit, the dielectric layer comprising an intermetal layer, the wiring being arranged in the intermetal layer, an electrically conductive through-substrate via contacting the wiring, and an optical filter element arranged immediately on the dielectric layer above the component sensitive to radiation. The dielectric layer comprises a passivation layer at least above the through-substrate via, the passivation layer comprises a dielectric material that is different from the intermetal layer, and the wiring is arranged between the main surface and the passivation layer.

The intermetal layer may comprise silicon dioxide. The optical filter element can be arranged immediately on the silicon dioxide of the intermetal layer.

In an embodiment of the semiconductor device the passivation layer is arranged in or on the intermetal layer, the passivation layer comprises an opening above the component sensitive to radiation, so that the intermetal layer is free from the passivation layer in the opening, and the optical filter element is arranged on the intermetal layer above or in the opening of the passivation layer.

In a further embodiment of the semiconductor device the optical filter element comprises a first structured filter layer providing an interference filter and a second structured filter layer providing at least one color component of an RGB filter.

In a further embodiment of the semiconductor device an integrated filter layer is arranged in the dielectric layer, so that the integrated filter layer is between the component sensitive to radiation and the optical filter element and is at a distance from the optical filter element.

In a further embodiment of the semiconductor device the dielectric layer comprises an intermetal layer, metal layers of the wiring and the integrated filter layer are arranged in the intermetal layer, and the integrated filter layer is formed in a metal layer that is arranged in the intermetal layer.

In a further embodiment of the semiconductor device the substrate and the dielectric layer together comprise a thickness (d) of less than 250 µm.

The method of producing a semiconductor device for detection of radiation comprises the steps of providing a semiconductor substrate with an integrated circuit including at least one component sensitive to radiation at or near a main surface, arranging a dielectric layer comprising at least one compound of a semiconductor material on or above the main surface, arranging a wiring of the integrated circuit in the dielectric layer, forming an electrically conductive through-substrate via contacting the wiring from a rear surface opposite the main surface, and arranging an optical filter element immediately on the dielectric layer above the component sensitive to radiation. The dielectric layer is formed to include an intermetal layer and a passivation layer, the passivation layer being provided with an opening above the component sensitive to radiation, the intermetal layer being free from the passivation layer in the opening, and the optical filter element is arranged on the intermetal layer and in the opening of the passivation layer.

In a variant of the method the optical filter element is arranged on the dielectric layer before the through-substrate via is formed.

In a further variant of the method the optical filter element is arranged on the dielectric layer after the through-substrate via is formed.

In a further variant of the method an integrated filter layer is arranged in the dielectric layer, and the integrated filter layer is formed as a nano-optics filter.

In a further variant of the method the integrated filter layer is formed before the through-substrate via is formed.

The following is a detailed description of examples of the semiconductor device and of the appertaining method of production.

DETAILED DESCRIPTION

Figure 1:
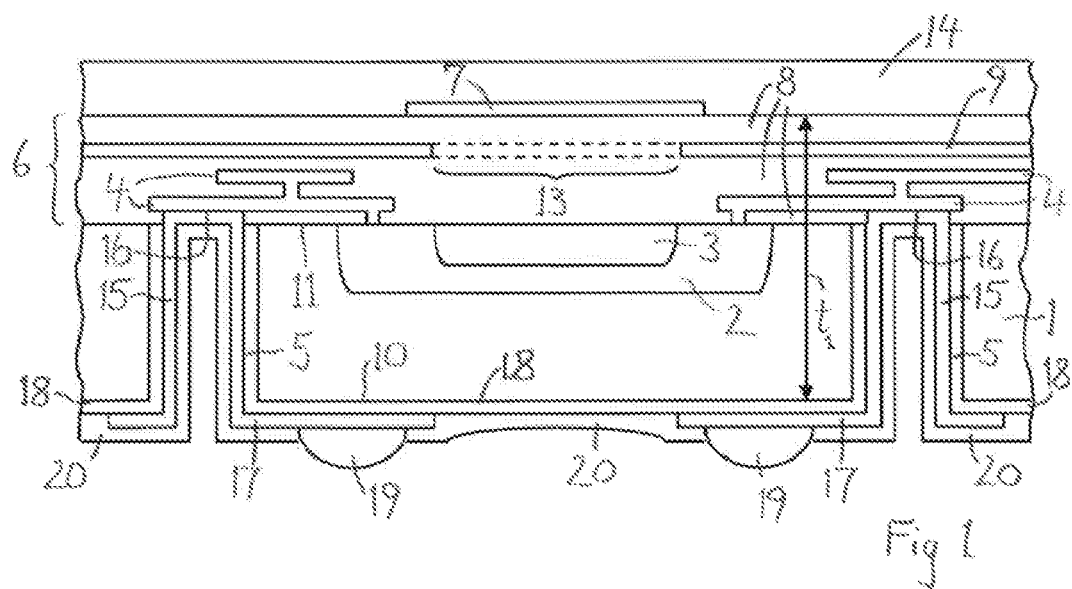
FIG. 1 is a cross section of an embodiment of the semiconductor device for detection of radiation.

FIG. 1 is a cross section of an embodiment of the semiconductor device for detection of radiation. A semiconductor substrate 1, which may be a silicon wafer, for instance, is provided with an integrated circuit 2 comprising at least one component sensitive to radiation 3 at or near a main surface 11 of the substrate 1. This can be a single device or a plurality of devices that are singulated by a later wafer dicing process. The integrated circuit 2 may further comprise a CMOS circuit or the like. The component sensitive to radiation 3 may be provided for optical applications, for instance, such as ambient light sensing, color sensing and proximity sensing, as well as for other applications including the detection of incident radiation. In particular, the component sensitive to radiation 3 may be a photodiode.

A wiring 4 is formed above the main surface 11 to provide electric connections to terminals of the integrated circuit 2 and, in particular, of the component sensitive to radiation 3.

The wiring 4 may be formed by structured metal layers embedded in an intermetal dielectric, for example. At least one through-substrate via 5 comprising a metallization 15 penetrates the substrate 1 in order to connect a contact area 16 of the wiring 4 with a rear wiring 17, which may be a redistribution layer, for instance, or the like. The rear wiring 17 may be a patterned metal layer, for example.

A dielectric layer 6 is arranged on the main surface 11 and serves to accommodate a filter structure above the component sensitive to radiation 3. The dielectric layer 6 comprises at least one compound of a semiconductor material, in particular an oxide or nitride of a semiconductor material like silicon, especially $SiO_2$, for example. In the embodiment according to FIG. 1 the dielectric layer 6 comprises intermetal layers 8 of the wiring 4.

A passivation layer 9, which may be a further dielectric material like a nitride of the semiconductor material, especially $Si_3N_4$, for example, may optionally be arranged within the dielectric layer 6 as shown in FIG. 1. The passivation layer 9 can have an opening 13 above the component sensitive to radiation 3, so that the passivation layer 9 may comprise a material that might lead to unwanted optical interferences of the radiation, which is however avoided by the opening 13 in the passivation layer 9. The passivation layer 9 may instead be an entire layer, as indicated in FIG. 1 by the broken lines.

A dielectric layer 18 on the rear side 10 of the substrate 1 and/or on the sidewall of the through-substrate via 5 may be provided to insulate the metallization 15 and/or the rear wiring 17 from the semiconductor material. The rear wiring 17 may be provided with bumps 19 for external electric connection and with a passivation 20 covering the areas of the rear side 10 that are not used for the external electric connection. The passivation 20 may be a deposited silicon nitride layer, for example, and may especially be applied to provide a moisture barrier and/or a mechanical protection for the metal of the rear wiring 17 and the through-substrate via 5.

The filter structure comprises an optical filter element 7 arranged immediately on the dielectric layer 6. The optical filter element 7 may be a structured filter layer 7 and may especially comprise a stack of different partial layers. Examples of such filters are ultraviolet cut-off filters, infrared cut-off filters, photopic filters, color filters, band-pass filters and any combination thereof. A transparent thin coating layer 14, which may typically be less than 30 μm thick, may be applied above for protection and/or for an optical modification.

It is an essential feature of the semiconductor device that the filter structure is not provided in or on a layer of glass and is not covered by a layer of glass, and hence no further substrate is necessary for the accommodation of the filter structure. This is important, because a substantial reduction of the overall height of the device is thereby achieved, which yields a small package size. The substrate 1 and the dielectric layer 6 may together comprise a thickness $t_1$ of less than 250 μm or even less than 200 μm. Therefore this semiconductor device allows the manufacture of very thin chip scale packages and thus offers considerable advantages in system integration, especially for consumer products. Furthermore, the filter structure is provided by a structured filter layer 7, which may be confined to the area of the component sensitive to radiation 3.

Figure 2:
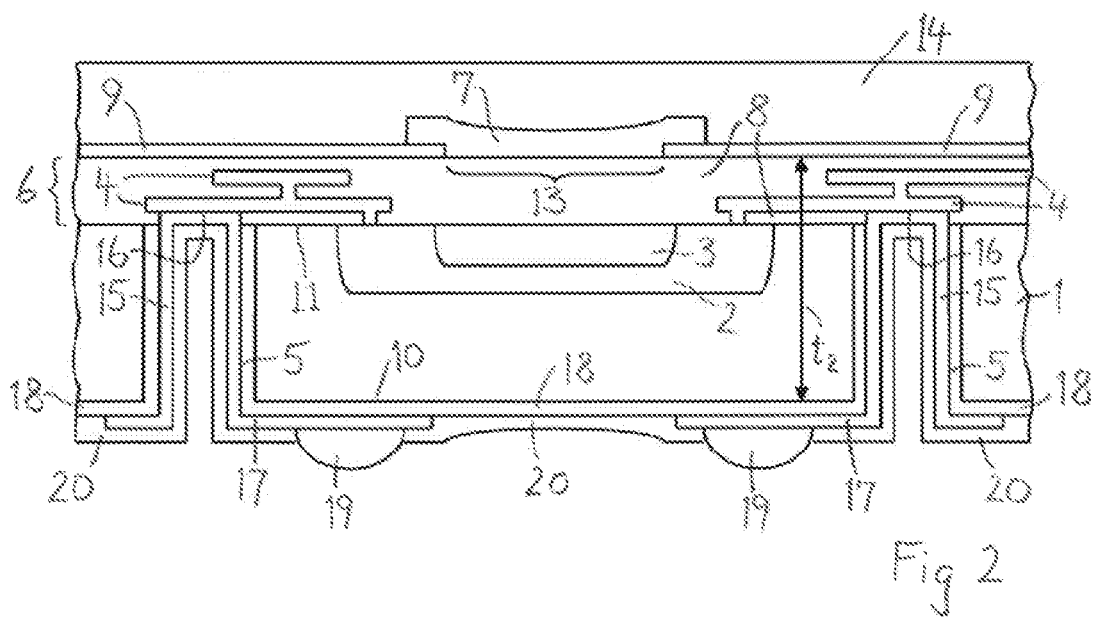
FIG. 2 is a cross section of a further embodiment of the semiconductor device.

FIG. 2 is a cross section of a further embodiment of the semiconductor device for detection of radiation. The elements of the embodiment according to FIG. 2 that correspond to similar elements of the embodiment according to FIG. 1 are designated with the same reference numerals. The embodiment according to FIG. 2 comprises a structured filter layer 7, which is arranged on the dielectric layer 6 and at least partially in the opening 13 of the passivation layer 9. In this embodiment there is no portion of the dielectric layer 6 above the passivation layer 9. A coating layer 14 may be applied on the passivation layer 9 and on the structured filter layer 7. In the embodiment according to FIG. 2, the substrate 1 and the dielectric layer 6 may together comprise a thickness $t_2$ of less than 250 µm or even less than 200 µm.

Figure 3:
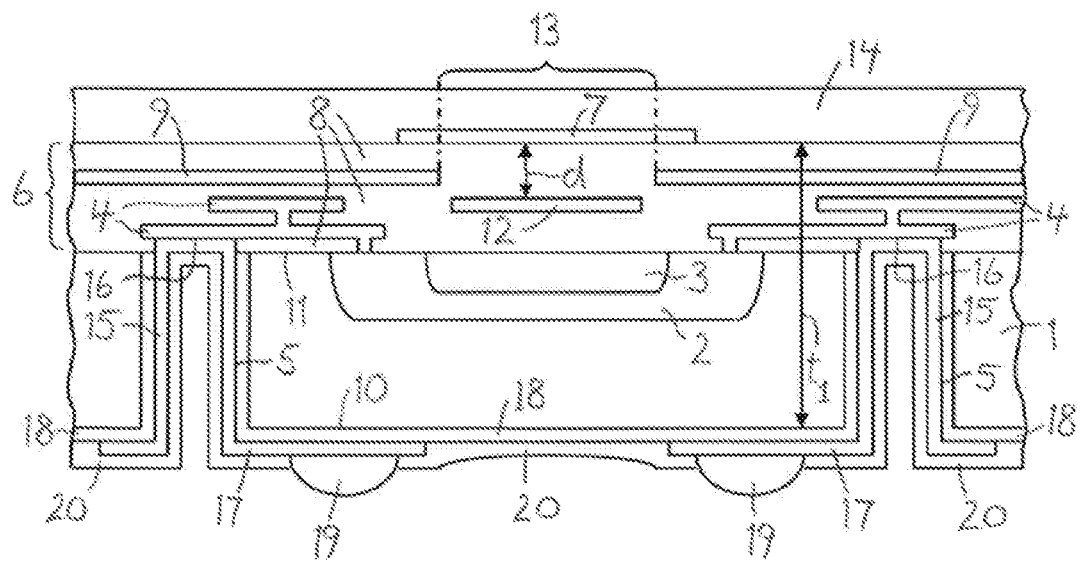
FIG. 3 is a cross section of an embodiment comprising an integrated filter layer.

FIG. 3 is a cross section of a further embodiment comprising an integrated filter layer 12. The elements of the embodiment according to FIG. 3 that correspond to similar elements of the embodiment according to FIG. 1 are designated with the same reference numerals. The integrated filter layer 12 is suitably structured to cover the component sensitive to radiation 3 and may be arranged in an intermetal layer 8 or between intermetal layers 8, in which the wiring 4 is embedded. The integrated filter layer 12 may especially be formed as a nano-optics filter, which may be structured in the wiring 4 or formed by a dedicated further metal layer, which may be arranged in an intermetal layer 8 or between intermetal layers 8. The integrated filter layer 12 may be arranged at a distance d from the structured filter layer 7. In the embodiment according to FIG. 3, the passivation layer 9, which is optional, is provided with an opening 13 in the area above the component sensitive to radiation 3. The passivation layer 9 may instead be a continuous entire layer according to the alternative embodiment indicated in FIG. 1 by broken lines.

Figure 4:
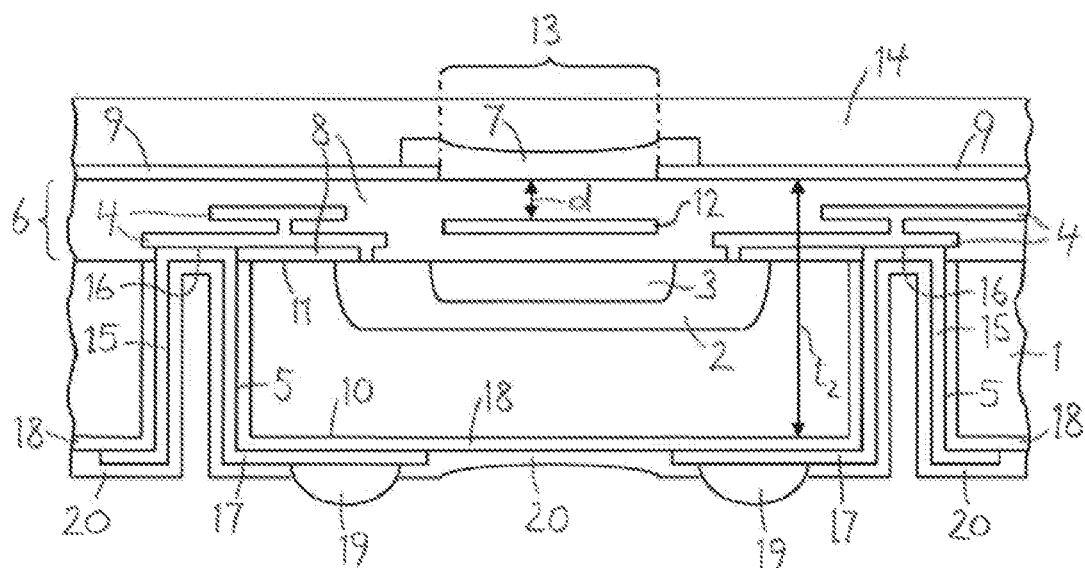
FIG. 4 is a cross section of a further embodiment comprising an integrated filter layer.

FIG. 4 is a cross section of a further embodiment comprising an integrated filter layer 12. The elements of the embodiment according to FIG. 4 that correspond to similar elements of the embodiment according to FIG. 2 are designated with the same reference numerals. In the embodiment according to FIG. 4, the structured filter layer 7 is arranged on the intermetal layer 8 in an opening 13 of a passivation layer 9, similar to the embodiment shown in FIG. 2. The integrated filter layer 12 may be arranged in the intermetal layer 8 or between intermetal layers 8 at a distance d from the structured filter layer 7 according to the embodiment shown in FIG. 3.

In both embodiments according to FIGS. 3 and 4 the integrated filter layer 12 is optional. The structured filter layer 7 and the integrated filter layer 12 may have different properties and may especially provide two different types of optical filters. The structured filter layer 7 may be a color filter, for instance, which is transparent for wavelengths in a selected range of the spectrum, like red, green or blue light. The color filter may be formed from an organic material, or it may be an interference filter. An interference filter can be formed by a sequence of layers comprising at least two different dielectric materials. The optical properties of the filter derive from the properties of the layers, and different layer sequences may consequently result in different types of interference filters like infrared filters, ultraviolet filters or color filters, for example. Different types of interference filters may be integrated on the same chip.

The semiconductor device is especially suitable for a production method in which a plurality of devices are produced on the same wafer for a chip scale package. In this case the filter structure may vary between the semiconductor devices that are produced on the same chip. It is thus also possible to produce a variety of sensor devices on the same chip, the individual devices being adapted for the detection of different radiation and/or having different sensitivities, for example.

Figure 5:
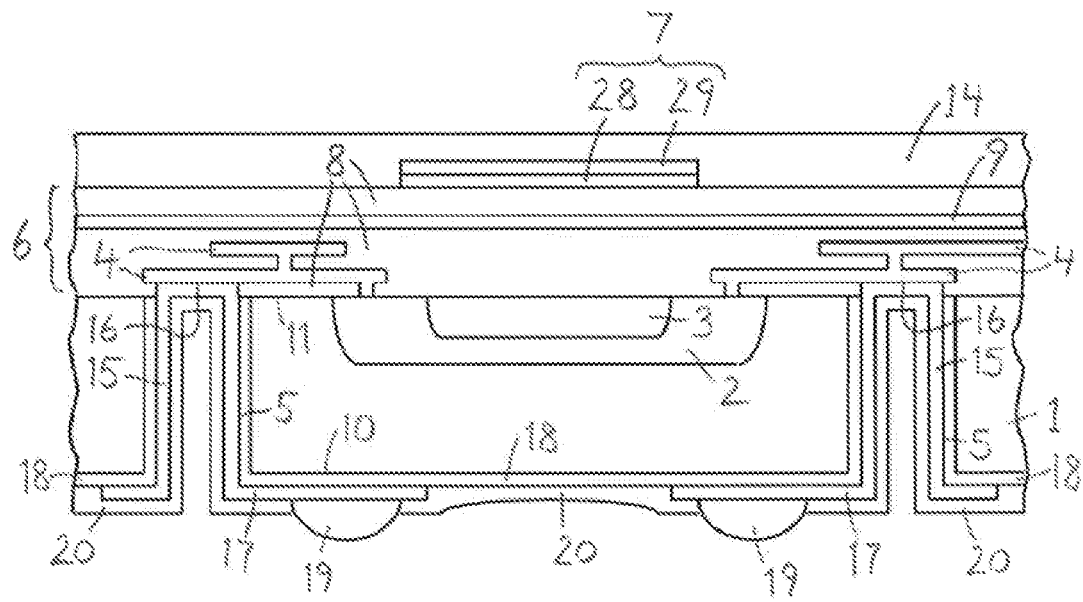
FIG. 5 is a cross section of an embodiment comprising two structured filter layers.

FIG. 5 is a cross section of an embodiment with a structured filter layer 7 that comprises a first layer 28 and a second layer 29. The elements of the embodiment according to FIG. 5 that correspond to similar elements of the embodiment according to FIG. 1 are designated with the same reference numerals. The first layer 28 may be an interference filter, for instance, and the second layer 29 may be an optical color filter, for instance, especially a color component of an RGB filter. In the embodiment shown in FIG. 5, an entire passivation layer 9, which is optional, is embedded in the dielectric layer 6. The passivation layer 9 may instead be provided with an opening above the component sensitive to radiation 3.

Figure 6:
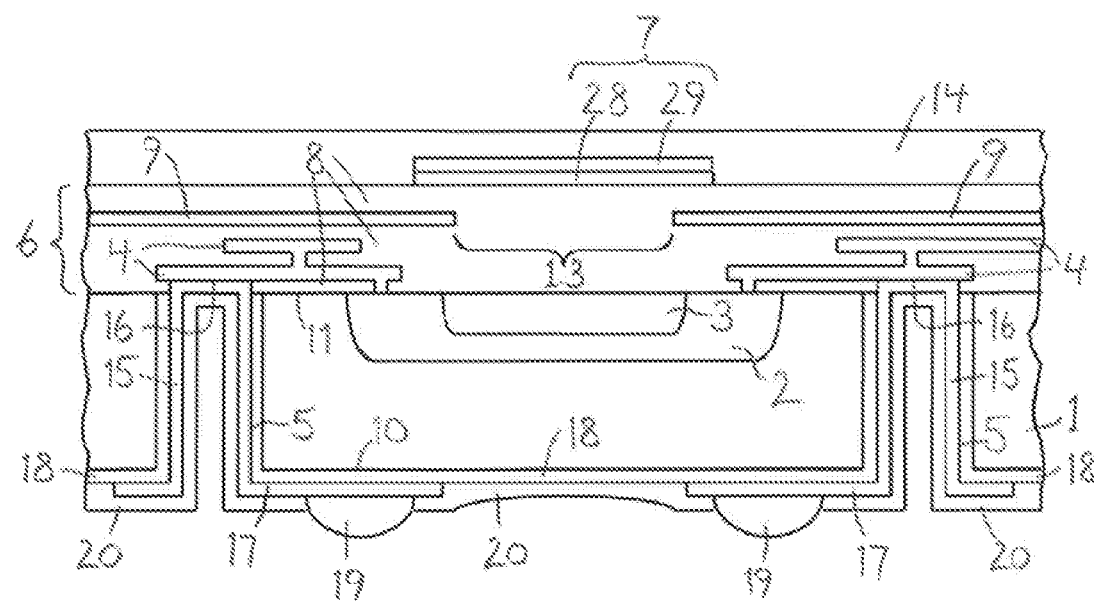
FIG. 6 is a cross section of a further embodiment comprising two structured filter layers.

FIG. 6 is a cross section of a further embodiment with a structured filter layer 7 that comprises a first layer 28 and a second layer 29. The elements of the embodiment according to FIG. 6 that correspond to similar elements of the embodiment according to FIG. 5 are designated with the same reference numerals. The embodiment according to FIG. 6 also comprises a passivation layer 9 arranged in the dielectric layer 6. The difference between the embodiment according to FIG. 6 and the embodiment according to FIG. 5 is the opening 13 in the passivation layer 9 above the component sensitive to radiation 3. The opening 13 allows the passivation layer 9 to comprise a material that might lead to undesirable optical interferences. Such a material would not affect the incidence of the radiation in the area of the opening 13.

Figure 7:
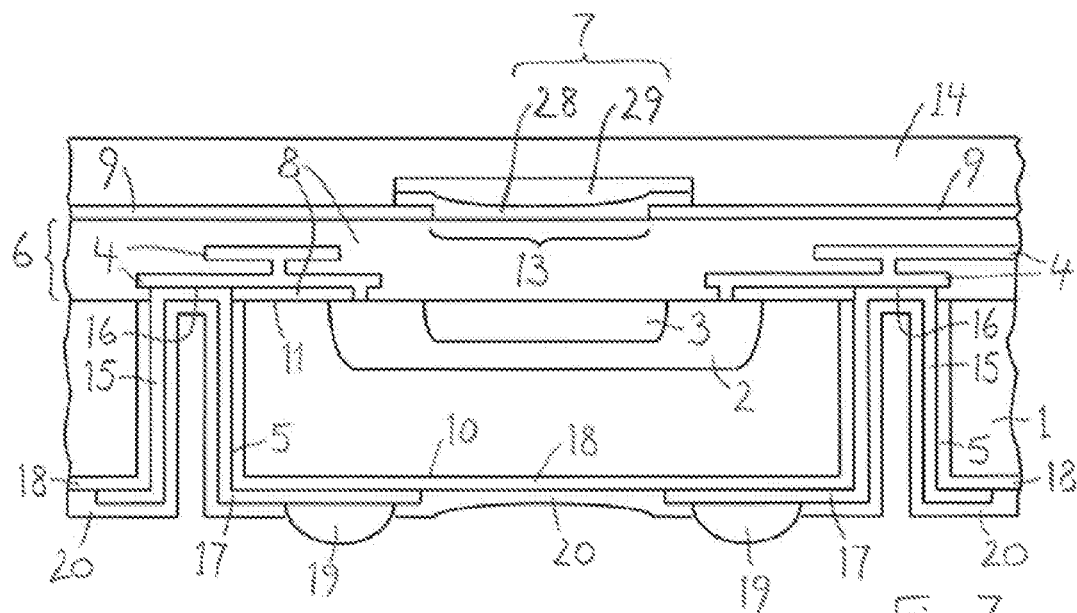
FIG. 7 is a cross section of a further embodiment comprising two structured filter layers.

FIG. 7 is a cross section of a further embodiment with a structured filter layer 7 that comprises a first layer 28 and a second layer 29. The embodiment according to FIG. 7 has a filter structure that is similar to the filter structure of the embodiment according to FIG. 2. The elements of the embodiment according to FIG. 7 that correspond to similar elements of the embodiment according to FIG. 2 are designated with the same reference numerals. The first layer 28 of the structured filter layer 7 may be an interference filter, for instance, and the second layer 29 of the structured filter layer 7 may be an optical color filter, for instance, especially a color component of an RGB filter. The structured filter layer 7 may be arranged immediately on the intermetal layer 8 in the opening 13 of the passivation layer 9 above the component sensitive to radiation 3.

Figure 8:
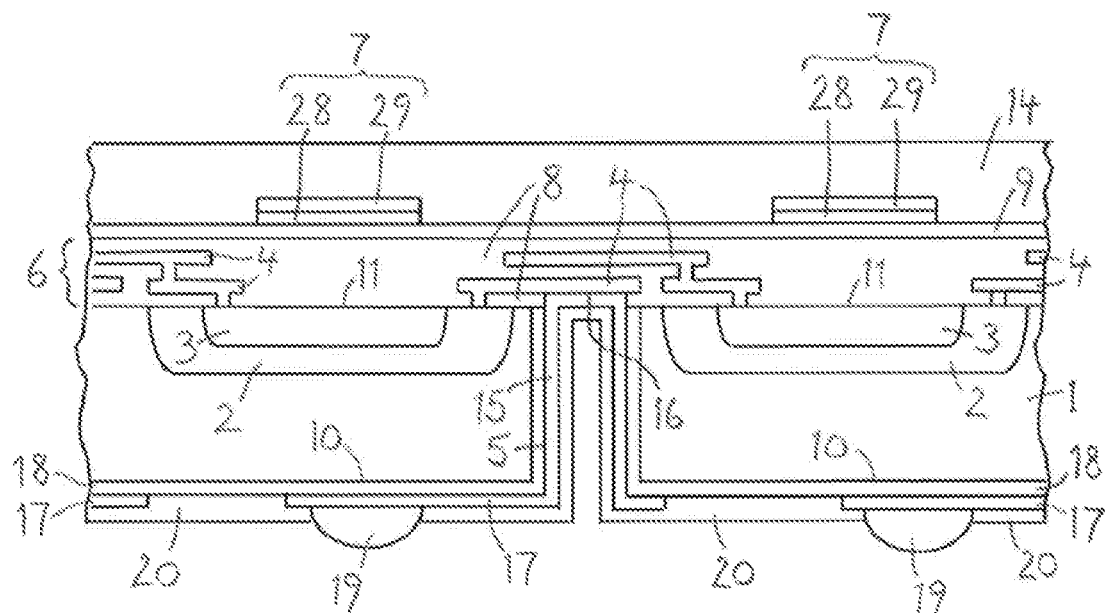
FIG. 8 is a cross section of an embodiment comprising an array of photodiodes.

FIG. 8 is a cross section of an embodiment comprising an array of photodiodes each comprising a separate portion of the structured filter layer 7. The distances between the photodiodes and the areas that are occupied by the through-substrate vias 5 may vary. The structured filter layer 7 may comprise a single layer or a sequence of layers, especially a double layer as shown in FIG. 8 as an example. If the first layers 28 or the second layers 29 of the portions of the structured filter layer 7 are different layers of an RGB filter, the array may be used to detect a colored image. In the embodiment according to FIG. 8, the passivation layer 9 is an entire layer, but the passivation layer 9 may instead be provided with openings 13 above the components sensitive to radiation 3 forming the array, as shown in FIG. 7.

Figure 9:
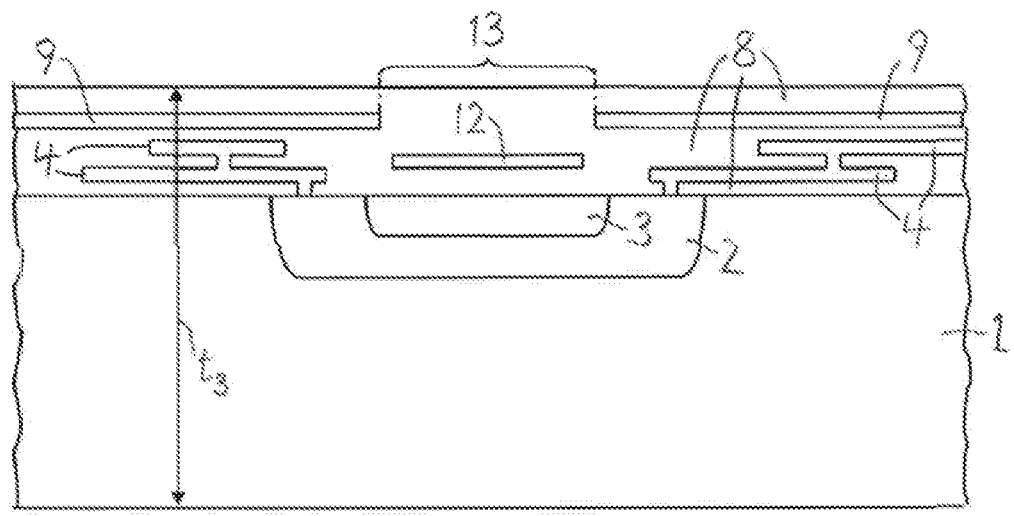
FIG. 9 is a cross section of an intermediate product of a production method for the embodiment according to FIG. 3.

FIG. 9 is a cross section of an intermediate product of a production method for the embodiment according to FIG. 3. The intermediate product may have a thickness $t_3$, as indicated in FIG. 9 by the vertical double-headed arrow, of typically 730 µm, for example. The substrate 1 is provided with the integrated circuit 2 comprising at least one component sensitive to radiation 3 at or near a main surface 11 of the substrate 1. One or more metallization levels of the wiring 4 may be produced according to a conventional CMOS process within the dielectric layer 6, which may comprise intermetal layers 8, especially silicon oxide forming an intermetal dielectric, for example. At this stage of the manufacturing process, integrated filter layers 12, in particular nano-optics filters, may also be arranged in the dielectric 6.

A passivation layer 9 may be formed, in particular from silicon nitride, within the dielectric layer 6 and can optionally be opened with a masked plasma etch above the component sensitive to radiation 3. This may be advantageous in order to avoid wavelength dependent variations of the intensity of the radiation which reaches the component sensitive to radiation 3. The surface of the dielectric layer 6 can be planarised with chemical mechanical polishing (CMP) steps, for instance. A local waviness, unevenness or roughness of the surface may be kept within a level range of less than 6 nm.

Figure 10:
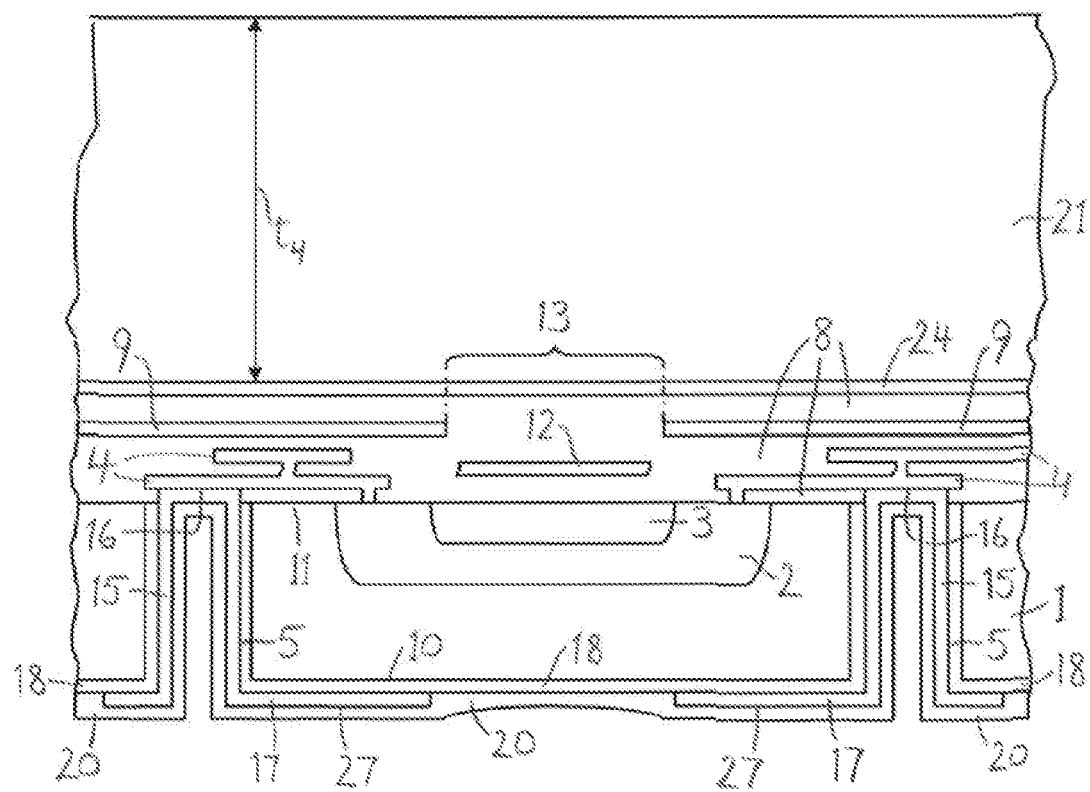
FIG. 10 is a cross section according to FIG. 9 after the application of a first handling wafer and further process steps.

FIG. 10 is a cross section according to FIG. 9 after the bonding of a first handling wafer 21 on the dielectric layer 6 and the production of the through-substrate via 5 and the rear wiring 17. The first handling wafer 21 may be a silicon wafer with a thickness $t_4$ of typically about 725 μm, for example. If the dielectric layer 6 is silicon oxide, a thin layer of thermal oxide 24, having a typical thickness of 400 nm, for example, is optionally formed on a main surface of the first handling wafer 21 by a thermal oxidation. The first handling wafer 21 can thus be bonded directly to the dielectric layer 6 as shown in FIG. 10. The first handling wafer 21 can instead be bonded to the dielectric layer 6 by means of an adhesive, which takes the place of the thermal oxide 24.

After the first handling wafer 21 has been bonded to the intermediate product shown in FIG. 9, the substrate 1 is thinned from the rear surface 10. The thinning may be performed by conventional grinding and polishing steps. The thickness of the substrate 1 is thus optionally reduced to less than 250 μm or even less than 200 μm. The first handling wafer 21 improves the mechanical stability of the thinned substrate 1.

A dielectric layer 18, which may be a silicon oxide layer, is optionally deposited on the rear surface 10 of the thinned substrate 1. The dielectric layer 18 is structured, which may be performed by a conventional photolithographic process using a resist mask. The produced structures are optionally aligned to structures at the main surface 11, especially to structures of the integrated circuit 2.

A via hole for the through-substrate via 5 is etched in the substrate 1, and the structured dielectric layer 18 is optionally used as a hard mask during the etching process. The sidewall of the via hole is optionally covered with silicon oxide. The contact area 16 of the wiring 4 is uncovered at the bottom of the via hole, suitably by an anisotropic spacer etch leaving the sidewall covered with the silicon oxide. This spacer etch removes the oxide selectively, so that the thickness of the metal layer of wiring 4 underneath is not significantly changed. Then the metallization 15 is applied.

The metallization 15 may be produced by a deposition of a thin barrier layer of titanium nitride or tantalum nitride, for instance, and a subsequent deposition of a metal layer. A layer of tungsten may be applied as the metal layer in conjunction with a barrier layer of titanium nitride, and a layer of copper may be applied in conjunction with a barrier layer of tantalum nitride. The metal layer is anisotropically etched, so that mainly the sidewall of the via hole remains covered with the metallization 15.

The rear wiring 17 may be produced by sputtering a further metal layer, which may be aluminum, for example. An area in which the further metal layer overlaps with the metallization 15 is favorable to ensure an electric connection of low resistivity between the metallization 15 and the further metal layer. The electric connection to the metallization 15 is maintained when the further metal layer is subsequently patterned into the structure intended for the rear wiring 17. A resist mask defining the pattern can be formed in a conventional photolithography step by applying a resist by means of spray-coating or by laminating a thin film resist on the rear surface 10, a subsequent masked exposure to ultraviolet light and development. The further metal layer is structured by an etching step, particularly by a plasma etching step, using the resist mask, which is afterwards removed.

The passivation 20, which may comprise a silicon oxide layer and a silicon nitride layer, for example, can then be applied by using plasma enhanced chemical vapor deposition (PECVD), whereby the sidewall of the through-substrate via 5 may also be coated. In a further photolithography and a subsequent further etching step, the passivation 20 is opened at locations provided for the bumps 19, which can be formed by applying solder balls on the uncovered pads or contact areas 27 of the rear wiring 17, for example.

Figure 11:
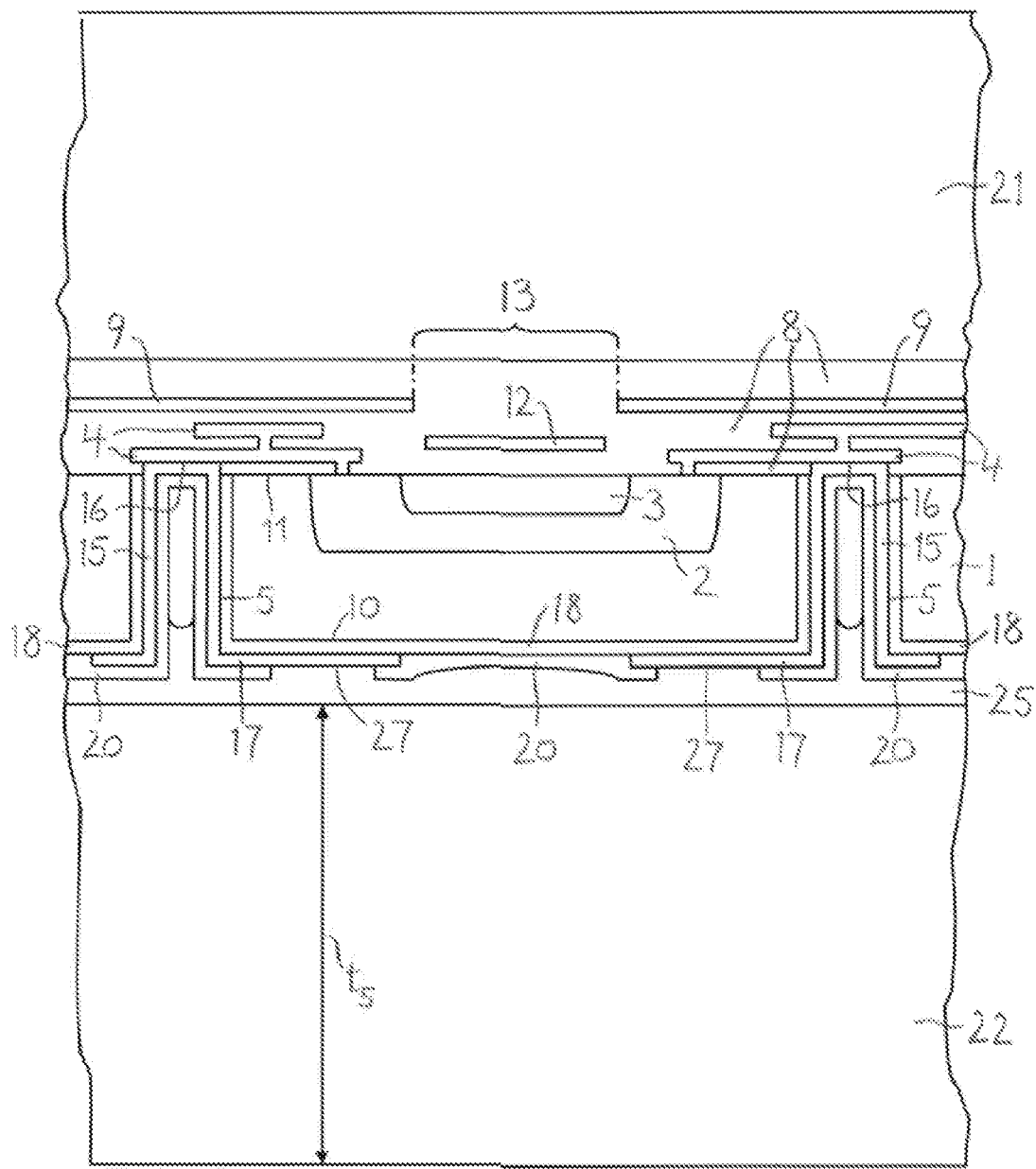
FIG. 11 is a cross section according to FIG. 10 after the application of a second handling wafer.

FIG. 11 is a cross section according to FIG. 10 after the application of a second handling wafer 22 on the side opposite the first handling wafer 21. The second handling wafer 22 allows to remove the first handling wafer 21 without impairing the mechanical stability of the substrate 1. The second handling wafer 22 may have a thickness $t_5$ of typically about 725 μm, for example, and may be a further silicon wafer. A connection layer 25 may be formed by a thermoplast coating on a surface of the second handling wafer 22 before it is adhesively bonded to the passivation 20 at an elevated temperature under mechanical pressure. A zone bonding method known per se can be used alternatively. The pads or contact areas 27 that are provided for the bumps 19 may be uncovered by forming openings in the passivation 20 before the second handling wafer 22 is bonded, as shown in FIG. 11.

The first handling wafer 21 is then removed. If the first handling wafer 21 is a directly bonded silicon wafer, it is first ground to a residual thickness of about 40 μm. The rest of the silicon can be removed by a wet chemical spin etch process, which stops on the thermal oxide 24 with a high selectivity. If the first handling wafer 21 is instead adhesively bonded, other appropriate process steps, which are known per se in semiconductor technology, can be applied, which may include the use of a laser, for example. In this case the first handling wafer 21 may be a glass wafer.

Figure 12:
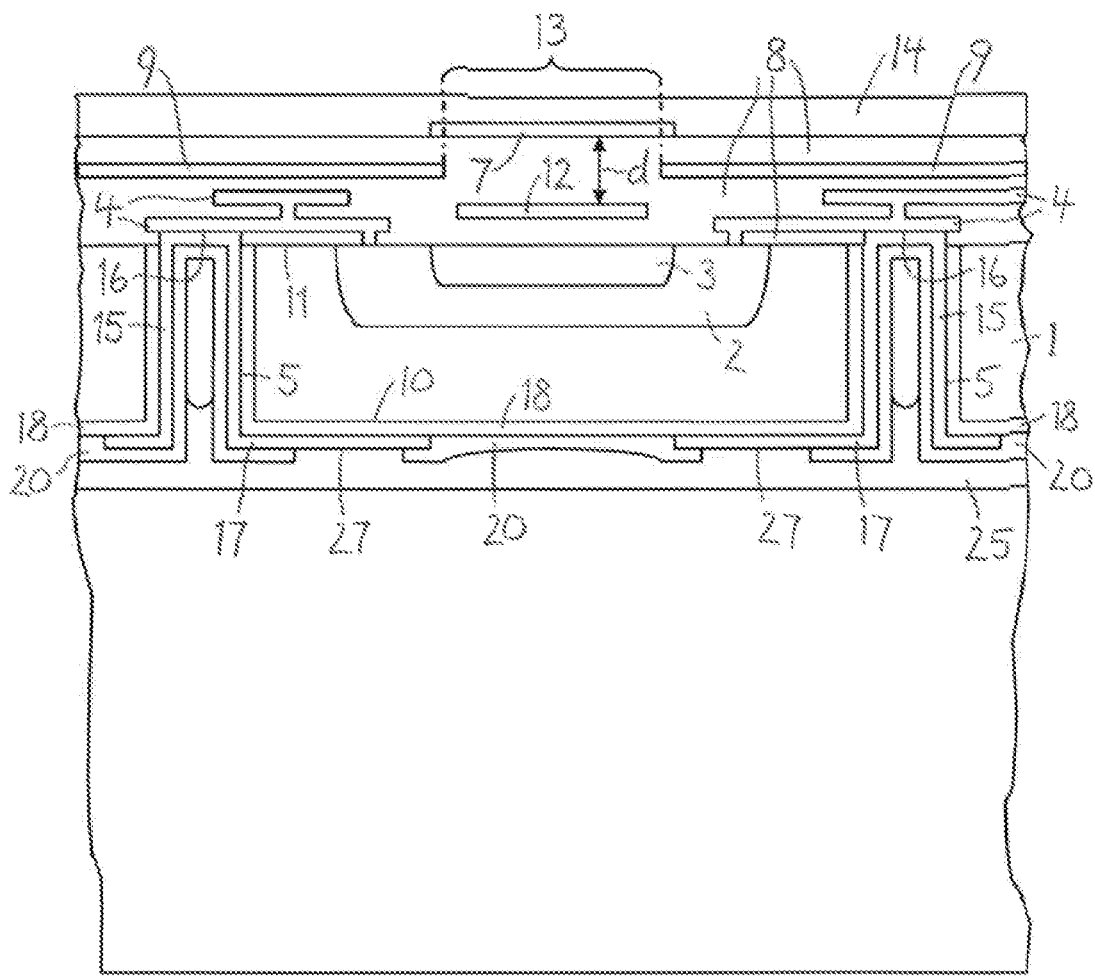
FIG. 12 is a cross section according to FIG. 11 after the removal of the first handling wafer and further process steps.

FIG. 12 is a cross section according to FIG. 11 after the removal of the first handling wafer 21 and further process steps, in which the structured filter layer 7 and the coating layer 14 are applied on the dielectric layer 6. The structured filter layer 7 is optionally confined to an area above the component sensitive to radiation 3, while the coating layer 14 may be applied to the entire surface in order to planarize the upper surface of the device and to protect the surface from damage.

When the second handling wafer 22 has been removed and the pads or contact areas 27 of the rear wiring 17 have been uncovered, the bumps 19 are applied. An underbump metallization (UBM) of nickel and gold may be produced on the contact areas 27 by an electroless plating process, for example. Solder balls forming the bumps 19 are attached to the underbump metallization, and a thermal reflow process is subsequently performed.

Figure 13:
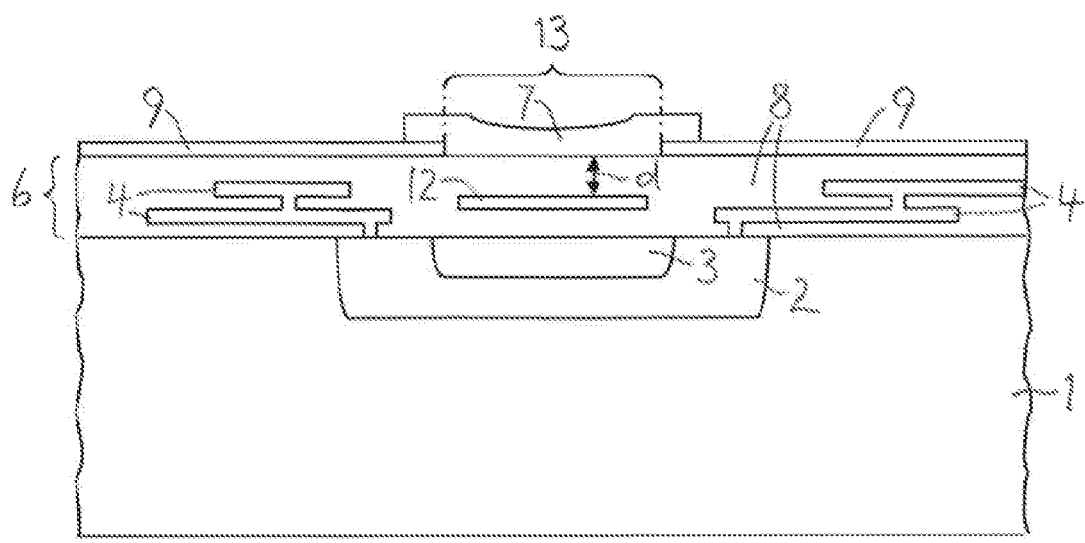
FIG. 13 is a cross section according to FIG. 9 for the embodiment according to FIG. 4.

FIG. 13 is a cross section according to FIG. 9 for the embodiment according to FIG. 4. The elements of the intermediate product according to FIG. 13 that correspond to similar elements of the intermediate product according to FIG. 9 are designated with the same reference numerals. In this variant of the method, the structured filter layer 7 is applied after the production of the dielectric layer 6 including the wiring 4 and, if the passivation layer 9 is provided, also after the application and structuring of the passivation layer 9 comprising the opening 13. The structured filter layer 7 is applied in the opening 13 on the dielectric layer 6. As shown in FIG. 13, the structured filter layer 7 can optionally surmount and overlap the edges of the passivation layer 9.

This method is favorably applicable in case that solely stacks of dielectric interference filters are required. The complete filter structure 7, 12 can be produced after the completion of the process producing the integrated circuit 2, in particular at the end of a CMOS process. In this case no planarised surface is required above the main surface 11.

Figure 14:
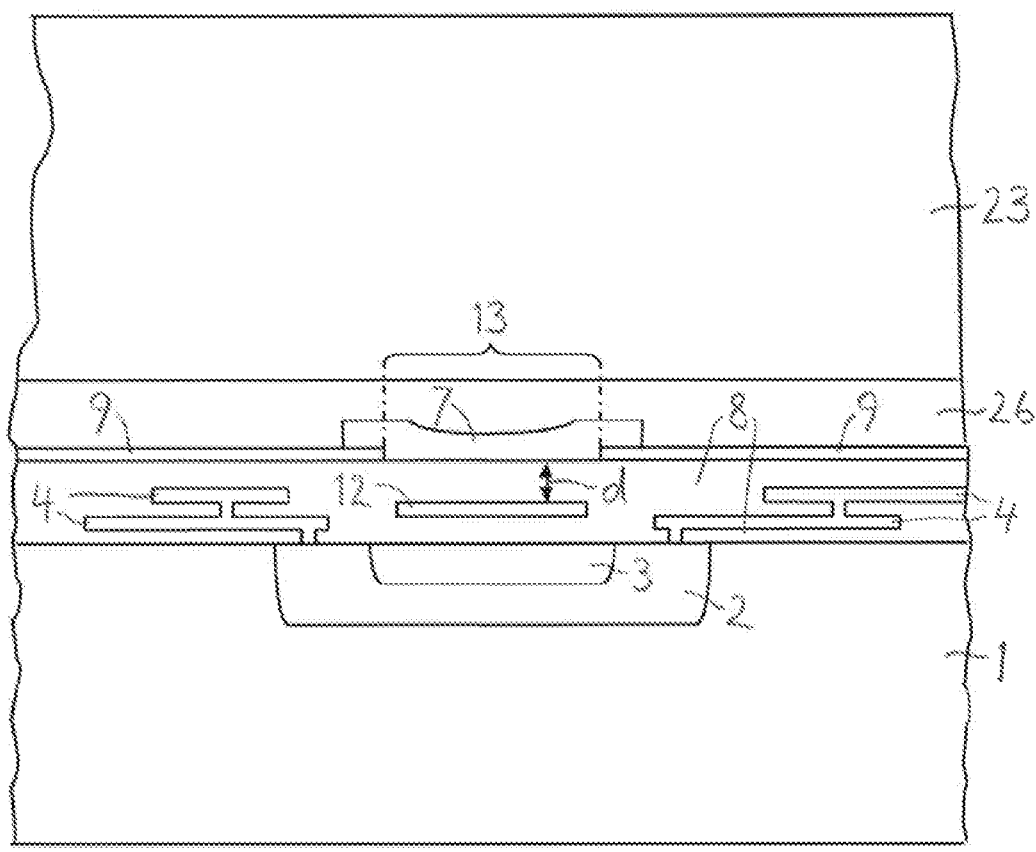
FIG. 14 is a cross section according to FIG. 13 after the application of a handling wafer.

FIG. 14 is a cross section according to FIG. 13 after the application of a third handling wafer 23, which corresponds to the first handling wafer 21 of the method previously described. The third handling wafer 23 can be bonded by means of a connection layer 26 formed of a removable thermoplast, for instance.

Figure 15:
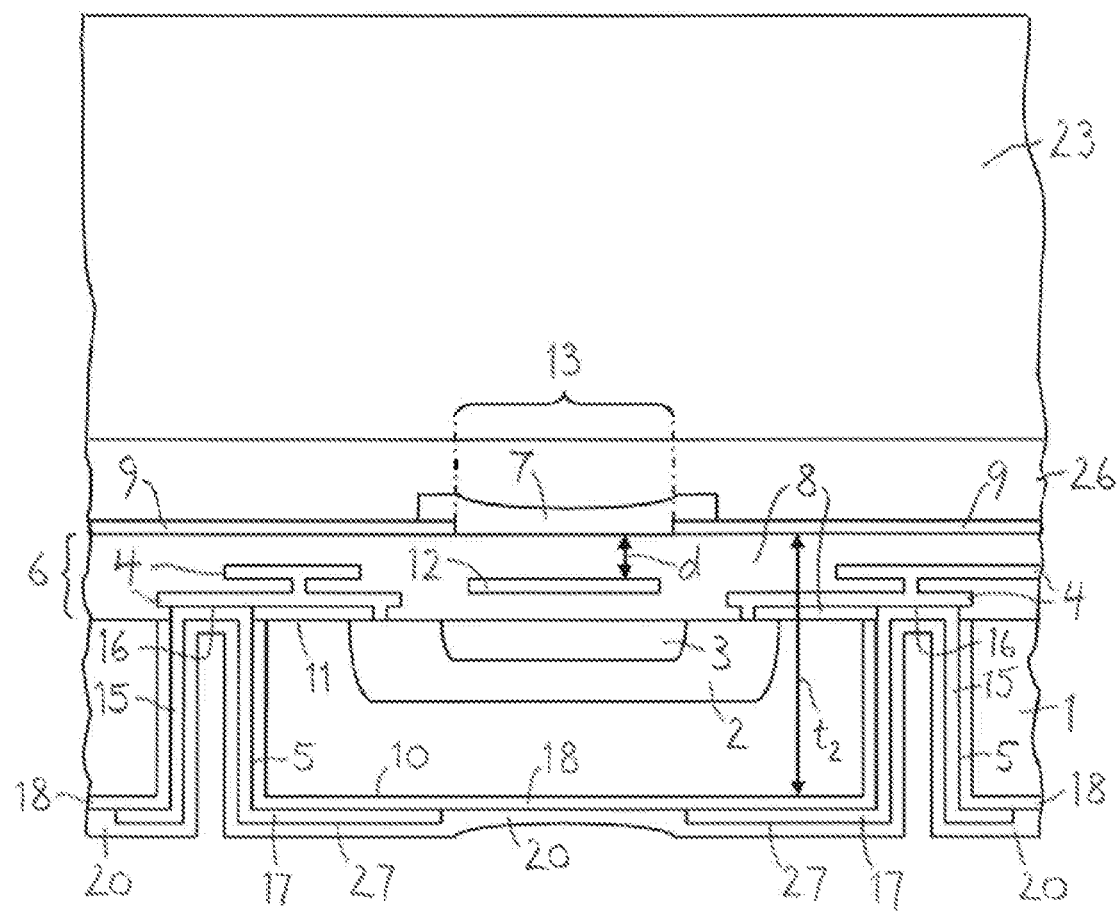
FIG. 15 is a cross section according to FIG. 14 after further process steps and before the removal of the handling wafer.

FIG. 15 is a cross section according to FIG. 14 after further process steps before the removal of the third handling wafer 23. After the third handling wafer 23 has been bonded to the intermediate product shown in FIG. 13, the substrate 1 is thinned from the rear surface 10 as described above. The thickness $t_2$ of the substrate 1 may thus be reduced to less than 250 μm or even less than 200 μm. The third handling wafer 23 improves the mechanical stability of the thinned substrate 1.

A dielectric layer 18, which may be a silicon oxide layer, may be deposited on the rear surface 10 of the thinned substrate 1 and structured as described above. A via hole for the through-substrate via 5 is etched in the substrate 1, and the structured dielectric layer 18 may be used as a hard mask during the etching process. The sidewall of the via hole is optionally covered with silicon oxide. The contact area 16 of the wiring 4 is uncovered at the bottom of the via hole, suitably by an anisotropic spacer etch leaving the sidewall covered with the silicon oxide.

Then the metallization 15 and the rear wiring 17 are applied as described above. The passivation 20, which may comprise a silicon oxide layer and a silicon nitride layer, for example, can then be applied as described above. The passivation 20 is opened at locations provided for the bumps 19. The pads or contact areas 27 of the rear wiring 17 are thereby uncovered. The third handling wafer 23 may now be debonded by removing the connection layer 26, and the third handling wafer 23 is thus removed from the device. An underbump metallization may be provided before the bumps 19 are applied on the pads or contact areas 27. The bumps 19 can be formed by solder balls, for example.

The described semiconductor device and the appertaining production method allow the manufacture of a very small chip scale package for semiconductor devices that are intended for the detection of radiation. The overall package height can be kept smaller than about 350 μm. This is a substantial improvement in comparison with conventional packages, which are at least 500 μm thick. It is essential for this achievement that the top cover of the device is glassless, so that no second substrate is necessary to implement the filter structure. This has the further advantage that chip dicing is facilitated and the chip out rate is dramatically reduced, leading to higher yield. The resistance of the device against moisture is improved and the reliability is enhanced. A plurality of different types of filters can easily be produced on the same chip and/or on the same semiconductor wafer.

The invention claimed is:

1. A semiconductor device for detection of radiation, comprising:
   a semiconductor substrate with a surface and an opposite surface;
   an integrated circuit comprising at least one component sensitive to radiation at or near the surface of the substrate;
   a dielectric layer arranged on the surface of the substrate, the dielectric layer comprising silicon dioxide;
   a first wiring of the integrated circuit, the first wiring being formed by a plurality of structured metal layers embedded in the dielectric layer and comprising a contact area;
   a rear wiring on the opposite surface of the substrate, wherein the rear wiring comprises one or more connection portions configured to electrically connect the semiconductor device to a device external to the semiconductor device;
   an electrically conductive through-substrate via comprising a metallization, which penetrates the substrate and connects the contact area of the first wiring with the rear wiring;
   a first passivation layer covering the rear wiring except along the one or more connection portions, wherein the first passivation layer is configured to provide at least one of moisture protection or mechanical protection for the rear wiring and the through-substrate via;
   a second passivation layer formed from silicon nitride, the second passivation layer being completely embedded in the dielectric layer, the first wiring being arranged between the second passivation layer and the substrate, the second passivation layer completely covering the through-substrate via and the first wiring, and wherein the second passivation layer is not in direct contact with the first wiring;
   an opening in the second passivation layer above the component sensitive to radiation;
   an upper surface of the dielectric layer formed from silicon dioxide covering the component sensitive to radiation, the first wiring and the through-substrate via, the upper surface of the dielectric layer being planar;
   an optical filter element arranged immediately on the upper surface of the dielectric layer to be at a higher level than the entire upper surface of the dielectric layer and above the component sensitive to radiation, wherein the optical filter element comprises a first layer and a second layer, wherein first layer is an interference filter and the second layer is an optical color filter;
   the dielectric layer penetrating the second passivation layer in a region located between the optical filter element and the substrate; and
   wherein there is an absence of electrically conductive material beyond an upper surface of the second passivation layer facing away from the substrate.

2. The semiconductor device of claim 1, wherein the substrate and the dielectric layer together have a thickness of less than 250 μm.

* * * * *